(12) United States Patent
Yuan et al.

(10) Patent No.: US 8,918,746 B1
(45) Date of Patent: Dec. 23, 2014

(54) CUT MASK AWARE CONTACT ENCLOSURE RULE FOR GRATING AND CUT PATTERNING SOLUTION

(71) Applicant: GLOBALFOUNDRIES Inc., Grand Cayman (KY)

(72) Inventors: Lei Yuan, Cupertino, CA (US); Jongwook Kye, Pleasanton, CA (US); Harry J. Levinson, Saratoga, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/018,074

(22) Filed: Sep. 4, 2013

(51) Int. Cl.
*G06F 17/50* (2006.01)
*G06F 19/00* (2011.01)
*G21K 5/00* (2006.01)
*G01N 23/00* (2006.01)
*G03F 1/00* (2012.01)
*H01L 21/00* (2006.01)

(52) U.S. Cl.
USPC .......... 716/54; 716/55; 716/52; 716/111; 700/120; 700/121; 700/108; 430/5; 378/35; 250/492.22; 438/32

(58) Field of Classification Search
CPC . G06F 17/5081; G06F 2217/12; G06F 19/00; G21K 5/00; G01N 23/00; G03F 1/00; H01L 21/00

USPC .......... 716/54, 55, 52, 111; 700/120, 121.108; 430/4, 5; 378/34, 35; 250/492.22; 438/32
See application file for complete search history.

(56) References Cited

U.S. PATENT DOCUMENTS

| | | | | |
|---|---|---|---|---|
| 5,608,708 | A * | 3/1997 | Ophey | 369/112.14 |
| 5,675,691 | A * | 10/1997 | Edlinger et al. | 385/130 |
| 6,891,225 | B2 * | 5/2005 | Horiguchi et al. | 257/331 |
| 7,538,854 | B2 * | 5/2009 | Ohsaki | 355/55 |
| 8,654,348 | B2 * | 2/2014 | Primot et al. | 356/521 |
| 2002/0034855 | A1 * | 3/2002 | Horiguchi et al. | 438/298 |
| 2004/0156299 | A1 * | 8/2004 | Sakai et al. | 369/112.1 |
| 2006/0158997 | A1 * | 7/2006 | Kim et al. | 369/112.03 |
| 2009/0274964 | A1 * | 11/2009 | Ohsaki | 430/30 |
| 2010/0245842 | A1 * | 9/2010 | Kato | 356/521 |
| 2011/0299375 | A1 * | 12/2011 | Yamazaki et al. | 369/53.28 |

OTHER PUBLICATIONS

U.S Appl. No. 13/746,508, filed Jan. 22, 2013.

* cited by examiner

*Primary Examiner* — Phallaka Kik
(74) *Attorney, Agent, or Firm* — Ditthavong & Steiner, P.C.

(57) ABSTRACT

Methodologies and an apparatus enabling a selection of design rules to improve a density of features of an IC design are disclosed. Embodiments include: determining a feature overlapping a grating pattern of an IC design, the grating pattern including a plurality of grating structures; determining a shape of a cut pattern overlapping the grating pattern; and selecting one of a plurality of rules for the feature based on the determined shape.

20 Claims, 13 Drawing Sheets

200

400

600

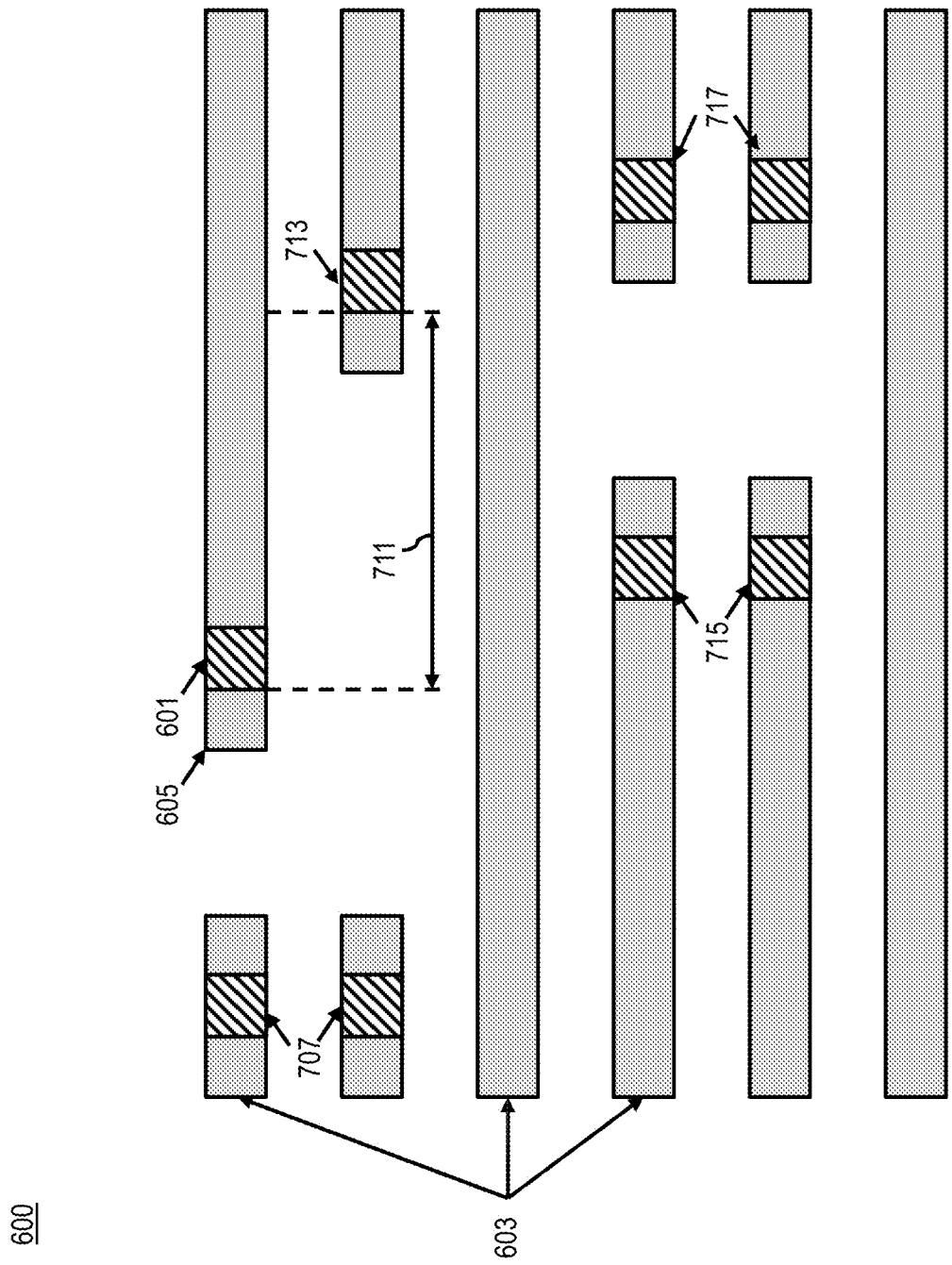

CUT MASK AWARE CONTACT ENCLOSURE RULE FOR GRATING AND CUT PATTERNING SOLUTION

TECHNICAL FIELD

The present disclosure relates to a manufacture of semiconductor devices. The present disclosure is particularly applicable to improving a density of features (e.g., cell utilization) for the 14 nanometer (nm) technology node and beyond.

BACKGROUND

In a fabrication of semiconductor devices, methods frequently attempt to balance a manufacturing yield of an IC design and a density of features. Due to the resolution limitation of single patterning processes, double patterning technology is frequently used to improve a density of features in fabricated semiconductor devices. One common double patterning technology involves creating very dense grating lines and subsequently applying a cutting mask, where the dense grating lines can be created by self-aligned double patterning (SADP) or directed self assembling (DSA). Along with various design rules (e.g., contact enclosure rule), such double patterning technology can enforce a manufacturing yield level for features beyond the limitation of single patterning technology. However, such design rules are frequently overly conservative, resulting in a low density of features.

A need therefore exists for a methodology enabling a selection of design rules that allow for a high density of features of IC designs while maintaining a manufacturing yield level and for an apparatus for performing the method.

SUMMARY

An aspect of the present disclosure is a method of improving a density of features of an IC design by, inter alia, determining a shape of a cut pattern of an IC design.

Another aspect of the present disclosure is an apparatus configured to improve a density of features of an IC design by, inter alia, determining a shape of a cut pattern of an IC design.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a feature overlapping a grating pattern of an IC design, the grating pattern including a plurality of grating structures; determining a shape of a cut pattern overlapping the grating pattern; and selecting one of a plurality of rules for the feature based on the determined shape.

Aspects include designating a type for a line end cut indicated by the cut pattern based on the determined shape, the selection of the one rule being further based on the cut type. Additional aspects include determining a separation distance between the feature and the line end cut, the selection of the one rule being further based on the separation distance. Further aspects include designating the cut type as an inner or outer vortex, the designation of an inner vortex indicating a process variation extending the cut pattern outside a region indicated by the cut pattern and the designation of an outer vortex indicating a process variation extending the cut pattern inside a region indicated by the cut pattern, wherein the plurality of rules include: conservative and tight enclosure rules assigning first and second minimum distances, respectively, between the feature and a line end of a contact structure for the feature, wherein the tight enclosure rule is selected for the feature when the cut type is designated as an outer vortex. Further aspects include a method, wherein the feature overlaps one grating structure of the plurality of grating structures and the cut pattern overlaps the grating structure, further including: determining whether the feature is on a time critical path of the IC design; and modifying the cut pattern to extend the grating structure based on the shape and on whether the feature is on a time critical path and the shape, wherein the selection of the one rule is based on the modified cut pattern. Some aspects include a method, wherein a conservative enclosure rule is selected for the feature and/or another feature of the IC design before modifying the cut pattern and a tight enclosure rule is selected for the feature and/or another feature of the IC design after modifying the cut pattern. Additional aspects include determining at least a portion of a cut mask design corresponding to the cut pattern, wherein the shape is determined based on the portion of the cut mask design. Some aspects include determining an alignment between the first feature and a second feature in the IC design, the first and second features being positioned on adjacent grating structures of the plurality of grating structures, wherein the determination of the shape is based on the determined alignment.

Another aspect of the present disclosure is an apparatus including: a processor; and a memory including computer program code for a program, the memory and the computer program code configured to, with the processor, cause the apparatus to perform the following, determine a feature overlapping a grating pattern of an IC design, the grating pattern including a plurality of grating structures; determine a shape of a cut pattern overlapping the grating pattern; and select one of a plurality of rules for the feature based on the determined shape.

Some aspects include an apparatus further caused to designate a type for a line end cut indicated by the cut pattern based on the determined shape, the selection of the one rule being further based on the cut type. Further aspects include an apparatus further caused to determine a separation distance between the feature and the line end cut, the selection of the one rule being further based on the separation distance. Some aspects include an apparatus further caused to designate the cut type as an inner or outer vortex, the designation of an inner vortex indicating a process variation extending the cut pattern outside a region indicated by the cut pattern and the designation of an outer vortex indicating a process variation extending the cut pattern inside a region indicated by the cut pattern, wherein the plurality of rules include: conservative and tight enclosure rules assigning first and second minimum distances, respectively, between the feature and a line end of a contact structure for the feature, wherein the tight enclosure rule is selected for the feature when the cut type is designated as an outer vortex. Further aspects include an apparatus, wherein the feature overlaps one grating structure of the plurality of grating structures and the cut pattern overlaps the grating structure and the apparatus is further caused to: determine whether the feature is on a time critical path of the IC design; and modify the cut pattern to extend the grating structure based on the shape and on whether the feature is on a time critical path, wherein the selection of the one rule is based on the modified cut pattern. Additional aspects include an apparatus, wherein a conservative enclosure rule is selected for the feature and/or another feature of the IC design before modifying the cut pattern and a tight enclosure rule is selected for the feature and/or another feature of the IC design after modifying the cut pattern. Some aspects include an apparatus further caused to determine at least a portion of a cut mask design corresponding to the cut pattern, wherein the shape is determined based on the portion of the cut mask design. Further aspects include an apparatus further caused to determine an alignment between the first feature and a second feature in the IC design, the first and second features being positioned on adjacent grating structures of the plurality of grating structures, wherein the determination of the shape is based on the determined alignment.

Another aspect of the present disclosure is a method including: determining a vertical interconnect access (VIA) overlapping a grating structure of a plurality of grating structures extending in one direction of an IC design; determining a shape of a cut pattern overlapping the grating structure; designating a cut of the grating structure indicated by the cut pattern as an inner or outer vortex based on the determined shape, the designation of inner vortex indicating a process variation extending the cut pattern outside a region indicated by the cut pattern and the designation of outer vortex indicating a process variation extending the cut pattern inside a region indicated by the cut pattern; and selecting a conservative or tight enclosure rule based on the designation of the cut, the conservative and tight enclosure rules defining first and second minimum distances, respectively, between the VIA and a line end of a contact structure for the VIA, wherein the first minimum distance is larger than the second minimum distance.

Some aspects include determining a separation distance between the VIA and the cut, the selection of the conservative or tight enclosure rule being further based on the separation distance. Further aspects include at least one of the following: determining at least a portion of a cut mask design corresponding to the cut pattern, wherein the shape is determined based on the portion of the cut mask design; and determining an alignment between the first VIA and a second VIA overlapping a second grating structure of the plurality of grating structures, the first and second gratings being adjacent, wherein the determination of the shape is based on the determined alignment. Further aspects include: determining whether the VIA is on a time critical path of the IC design; and modifying the cut pattern to extend the grating structure based on whether the feature is on a time critical path and on the determined shape and/or designated cut, wherein a conservative enclosure rule is selected for the VIA and/or another VIA of the IC design before modifying the cut pattern and a tight enclosure rule is selected for the VIA and/or another VIA of the IC design after modifying the cut pattern.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 6, 7B, and 8 schematically illustrate another process allowing a high density of features in IC designs using an alignment between features, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reduced manufacturing yield level attendant upon improving a density of features in an IC design, particularly in IC designs utilizing a grating pattern and a contact enclosure rule. In accordance with embodiments of the present disclosure, the problems are solved, for instance by, inter alia, determining a shape of a cut pattern of an IC design.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
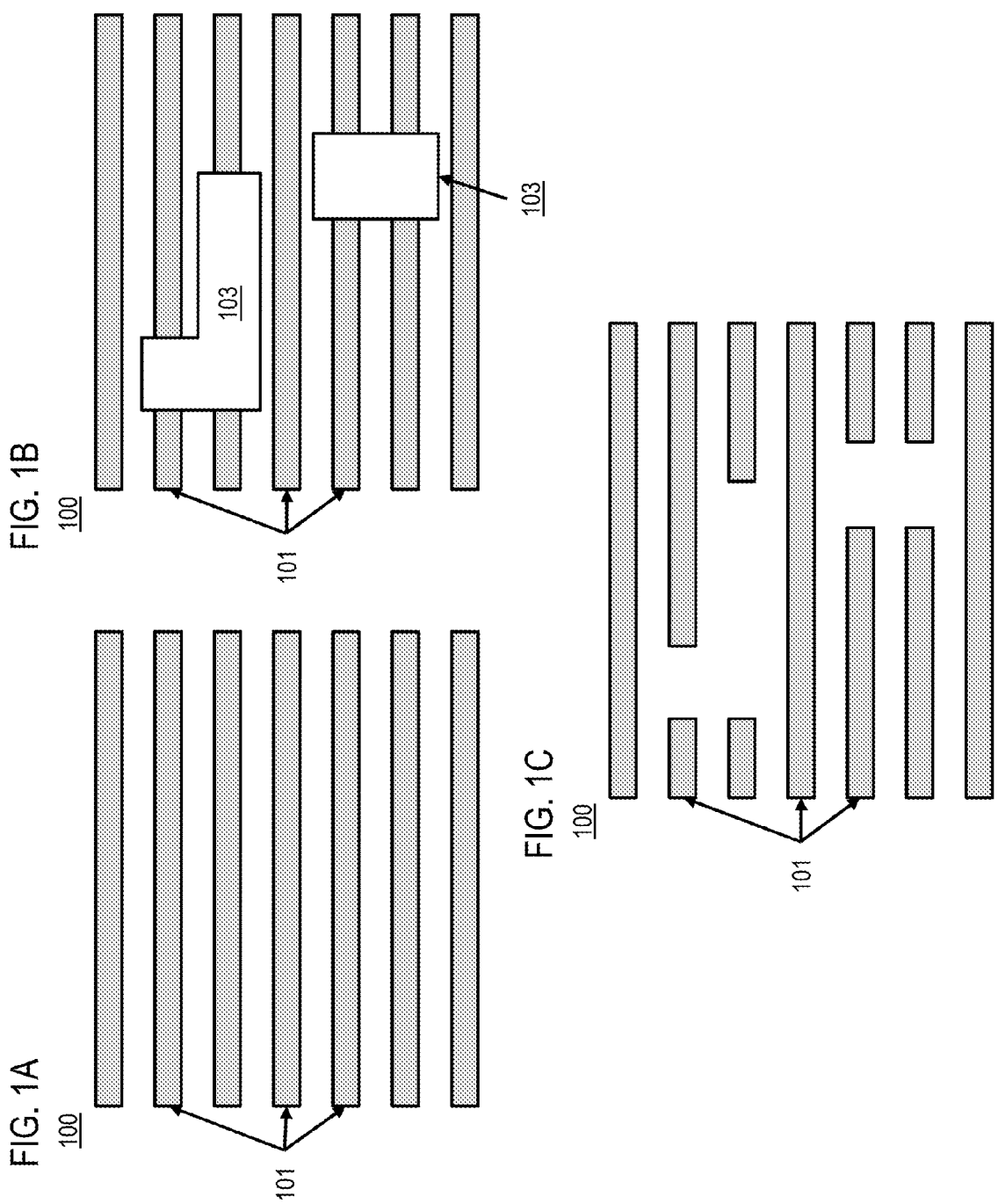
FIGS. 1A, 1B, and 1C schematically illustrate forming an IC using a grating pattern and a cut mask, in accordance with an exemplary embodiment.

FIGS. 1A, 1B, and 1C schematically illustrate forming an IC using a grating pattern and a cut mask, in accordance with an exemplary embodiment. Adverting to FIG. 1A, a grating 101 is formed on a substrate 100 using DSA lithography. Alternatively, the grating 101 is formed by various processes such as, for instance, SADP, LELE, litho-etch-litho-etchlitho-etch (LELELE), and the like. Adverting to FIG. 1B, a cut mask 103 is provided on the substrate 100 and the grating 101, thereby removing covered portions of the grating 101 as illustrated in FIG. 1C.

Figure 2:
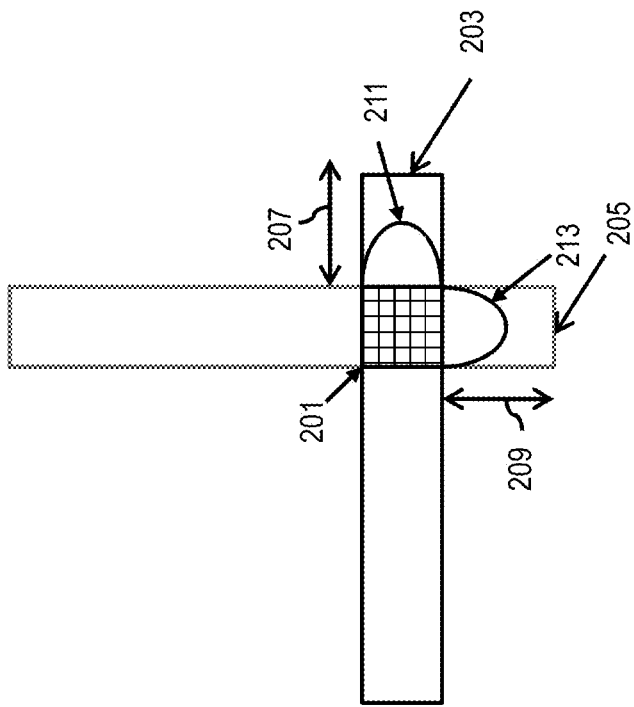
FIG. 2 illustrates a contact enclosure rule for a feature, according to an exemplary embodiment.

FIG. 2 illustrates a contact enclosure rule for a feature, according to exemplary embodiments. As illustrated, FIG. 2 includes a contact 201 of an IC design 200 that is within lower and upper layer contact enclosures 203 and 205, respectively. The contact enclosures 203 and 205 define minimum distances 207 and 209, respectively, to accommodate process variations, such as line end shortening 211 and 213. A tight contact enclosure rule, for instance contact enclosure 203 having a small minimum distance (e.g., 8 through 12 nm), frequently results in an improved chip density over a conservative contact enclosure rule having a large minimum distance (e.g., 28 through 32 nm). As shown, the lower and/or upper layers can be a poly gate, metal (e.g., metal 1, metal 2, etc.), or other layers.

Figure 3:
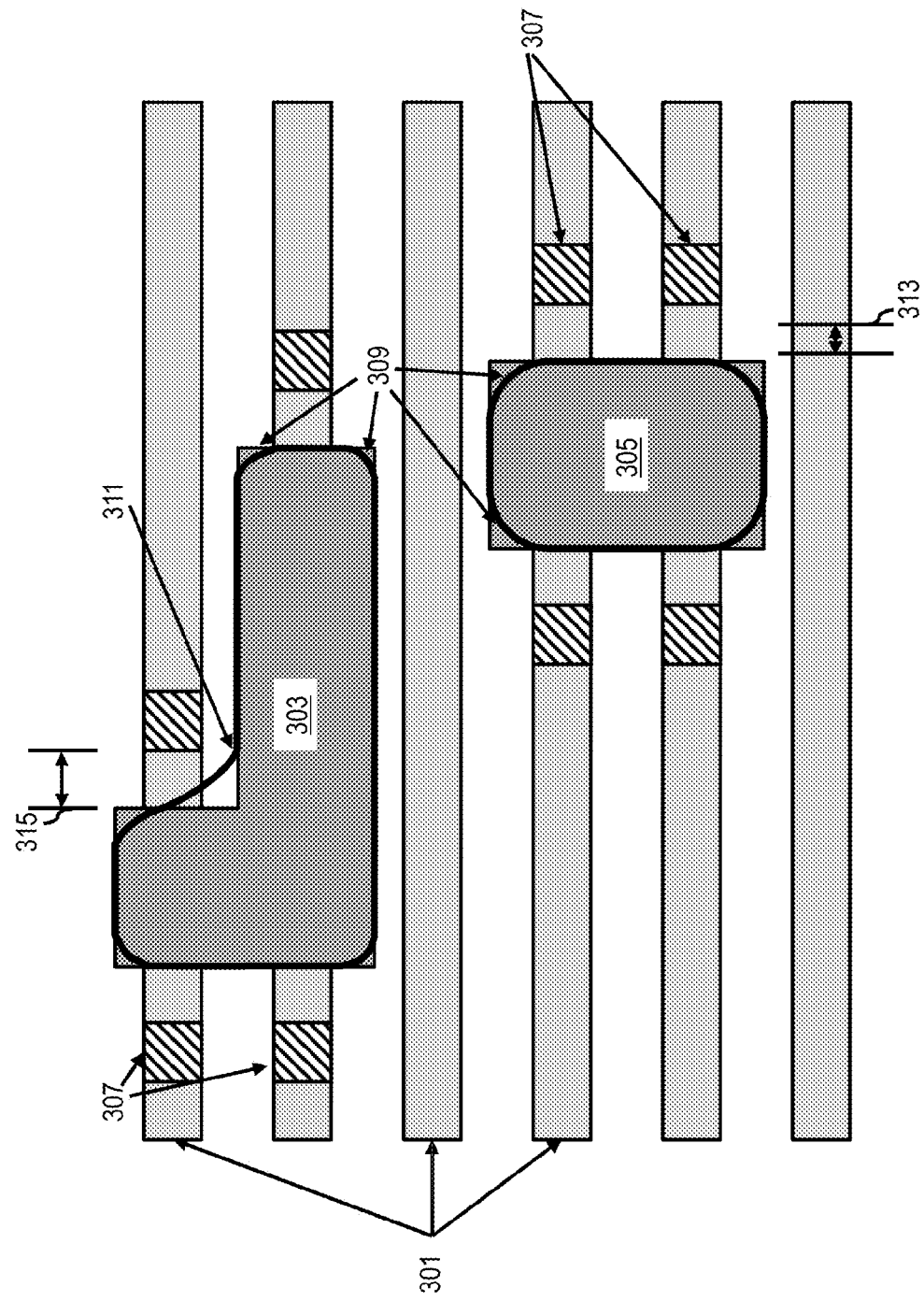
FIG. 3 illustrates an IC design, according to exemplary embodiments.

FIG. 3 illustrates an IC design, according to exemplary embodiments. FIG. 3 includes grating 301, cut mask design shapes 303 and 305, and features (e.g. VIAs) 307. As shown, processing variation results in cuts 309 having an outer vortex cut type and cut 311 having an inner vortex cut type. For example, an inner vortex cut type is a cut having at least one vortex of a cut edge that is an inner vortex and an outer vortex cut type is a cut having no vortex of a cut edge that is an inner vortex. As cuts 309 have a process variation extending inside the cut mask patterns 303 and 305 a minimum distance 313 can be used to maintain a manufacturing yield level. Likewise, as cut 311 has a process variation extending outside the cut mask design shape 303 a minimum distance 315 can be used to maintain the manufacturing yield level. However, as mentioned above, many traditional methods do not account for a cut mask shape (e.g., 303 and 305) or a type of cut (e.g., 309 and 311). As such traditional methods frequently utilize only minimum distance 315 to ensure the manufacturing yield level, resulting in a low density of features.

Figure 4:
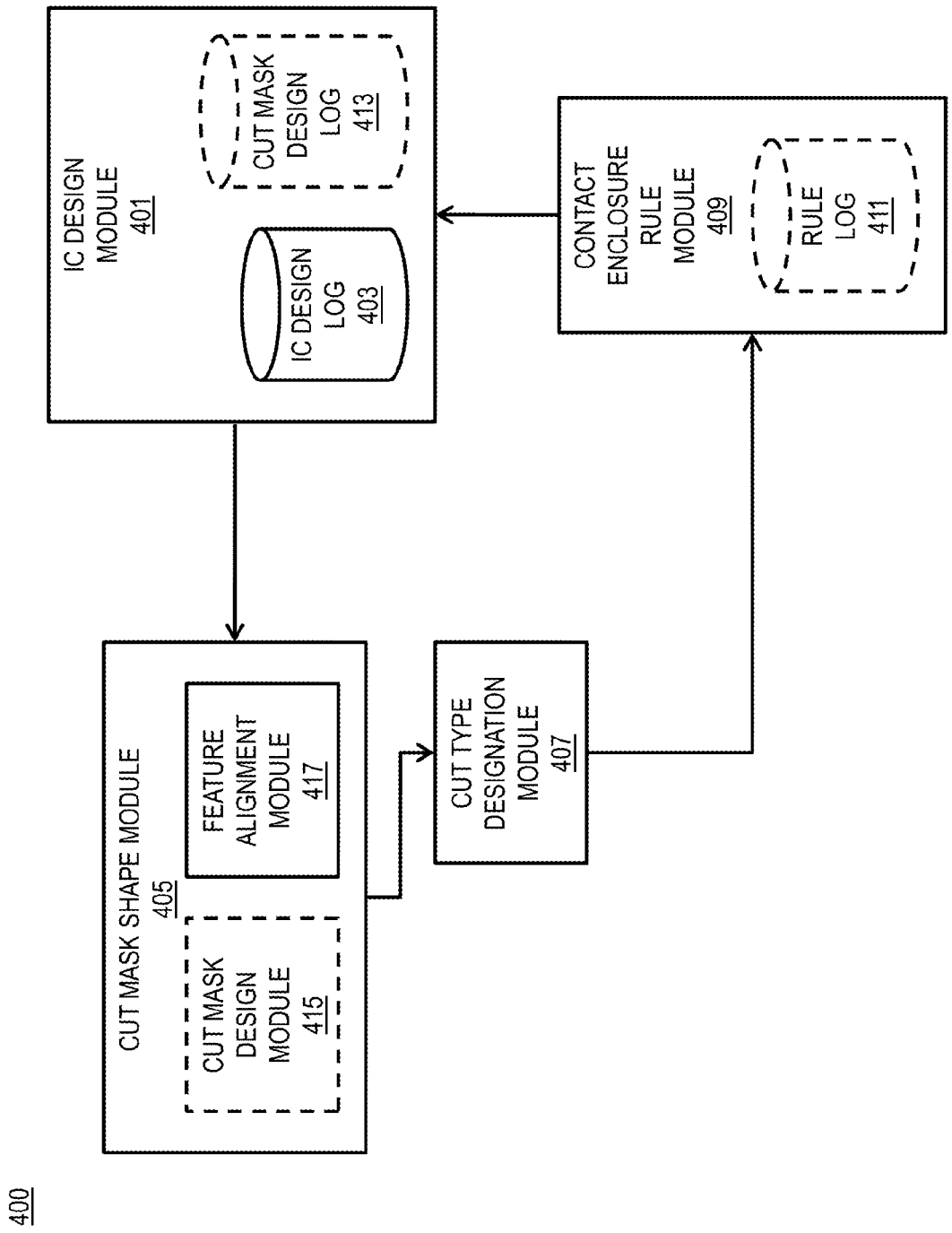
FIG. 4 illustrates a system allowing for a high density of features of IC designs, according to an exemplary embodiment.

FIG. 4 illustrates a system allowing for a high density of features of IC designs, according to an exemplary embodiment. As shown, a system 400 includes an IC design module 401 having IC design log 403, cut mask shape module 405 and contact enclosure rule module 409 having rule log 411. The system 400 may optionally include cut type designation module 407, cut mask design log 413 and cut mask design module 415. Modules 401, 405, 407, and 409 may be combined.

IC design module 401 is configured to generate and/or facilitate a generation of an IC design stored in IC design log 403. In some instances the IC design module 401 is commercial or proprietary software for generating IC designs. The IC design module 401 may optionally include or have access to log 413 that indicates a cut mask design. The IC design module 401 may be further configured to determine an end of line (e.g., cut) on a grating structure overlapping a feature to facilitate a rule to designate to the feature. For instance, a separation distance between the end of line of the grating structure and the feature may be used by the contact enclosure rule module 409 to designate a tight enclosure rule when the separation distance exceeds a threshold value.

The IC design module 401 may optionally be configured to identify a line end and/or feature based on a shape of a cut pattern. For example, the IC design module 401 identifies a line end of a grating structure to be cut by a cut pattern having an L-type shape and/or an inner vortex cut type. Additionally, the IC design module 401 may optionally determine whether a line end and/or feature is part of a time critical path. For instance, the IC design module 401 determines a line end and/or feature to be on a time critical path when the line end and/or feature is part of an electrical circuit having a timing delay exceeding a threshold value. In another example, the IC design module 401 determines a line end and/or feature to not be on a time critical path when the line end and/or feature is within an electrical circuit not sensitive to timing delay. Additionally, the IC module 401 may optionally extend the line end. For example, the IC module 401 extends a line end to remove a misalignment between the line end and another line end having a same cut mask pattern and/or to remove an inner corner of a feature.

Shape module 405 is configured to determine a shape of a cut pattern of an IC design from log 403 and/or cut mask design log 413. As shown, the shape module 405 optionally includes cut mask design module 415 and a feature alignment module 417. The shape module 405 designates a shape, portion of a shape, a type of corner, or a combination thereof to a particular feature. For instance, the shape module 405 designates an L-type shape, an L-type or rectangular type portion of the L-type shape, a inner or outer type rounding corner of a L-type shape, or a combination thereof to a particular feature. Other shapes may include, for instance, C-type, U-type, and the like.

Cut mask design module 415 is configured to access a log 413 to determine a shape of a cut pattern. For instance, cut mask design module 415 determines a shape of a cut mask design from log 413 corresponding to a feature and/or grating structure overlapping the feature of an IC design from log 403. As discussed above, each feature may be designated separately from other features corresponding to a single cut shape. For instance, the cut mask design module 415 designates a feature corresponding to a C-type cut mask design shape as a rectangular portion (or outer corner) and designates another feature corresponding to the same C-type cut mask design shape as a C-type portion (or inner corner).

Feature alignment module 417 is configured to determine a shape based on an alignment between features in an IC design from log 403. Specifically, alignment module 417 determines features on adjacent grating structures in an IC design from log 403, and compares vertical positions of the features to identify a shape. For instance, features having vertical positions within a threshold value are designated as aligned, while features having vertical positions exceeding the threshold value are designated as not aligned. Furthermore, a series of aligned features can be designated as a rectangular shape, while misaligned features may be designated as having a U-shape, L-shape, C-shape, and the like.

Cut designation module 407 is configured to designate a type for a cut indicated by a cut shape. For instance, the cut designation module 407 receives an indication that a feature is cut by an L-type (or U-type, C-type, etc.) shape and designates a type of cut as an inner vortex. In another example, the cut designation module 407 receives an indication that a feature is cut by a portion of an L-type (or U-type, C-type, etc.) and designates a type of cut as an inner vortex. In yet another example, the cut designation module 407 receives an indication that a feature is cut by an inner corner and designates a type of cut as an inner vortex. Alternatively, the cut designation module 407 receives an indication that a feature is cut by a rectangular shape, a portion of a rectangular shape, an outer corner, or a combination thereof, and designates a type of cut as an outer vortex. In one example, the designation of an inner vortex indicates a process variation extending the cut pattern outside a region indicated by the cut pattern and a designation of an outer vortex indicates a process variation extending the cut pattern inside a region indicated by the cut pattern.

Contact enclosure rule module 409 is configured to select a rule. For instance, rule module 409 receives a shape (or a cut type) designated to a feature and creates or selects a rule for a contact enclosure for the feature. Such a rule may be selected from a set of rules stored in log 411. For instance, the set of rules may include conservative and tight enclosure rules assigning large and small minimum distances, respectively, between the feature and a line end of a contact structure for the feature.

Figure 5:
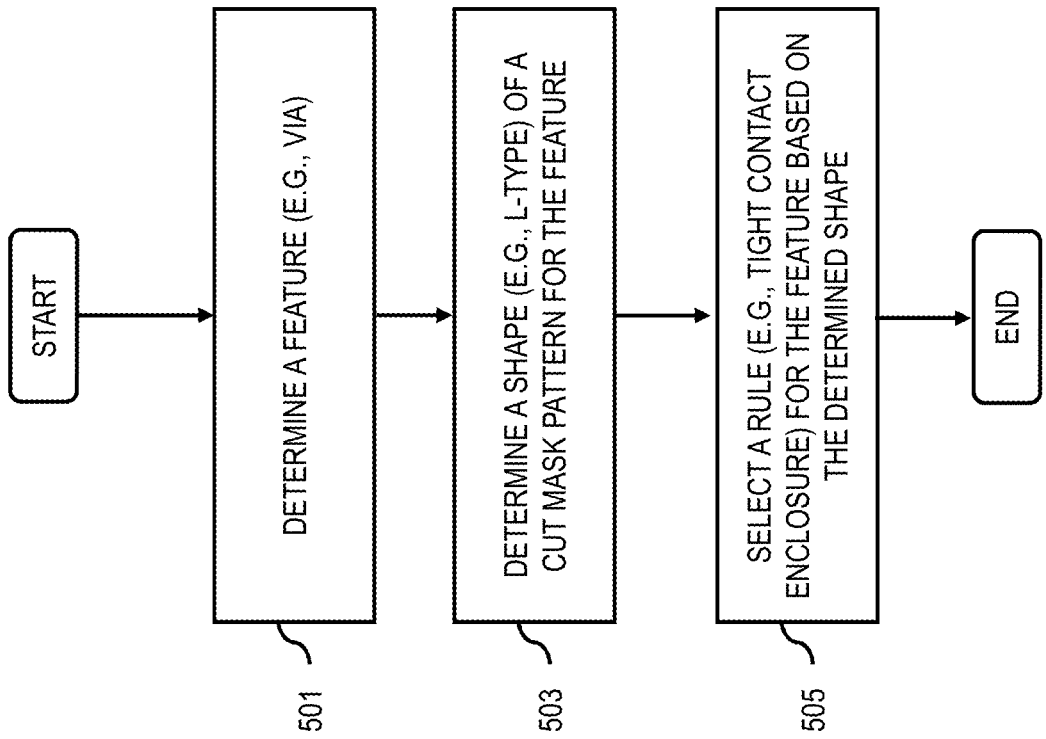
FIG. 5 is a flowchart of a process for allowing for a high density of features of IC designs, according to an exemplary embodiment.

FIG. 5 is a flowchart of a process for allowing for a high density of features of IC designs, according to an exemplary embodiment. For illustrative purposes, process 500 is described with respect to the system of FIG. 4 and illustrated in the steps of FIGS. 6, 7A, 7B, and 8. It is noted that the steps of process 500 may be performed in any suitable order, as well as combined or separated in any suitable manner.

Figure 6:
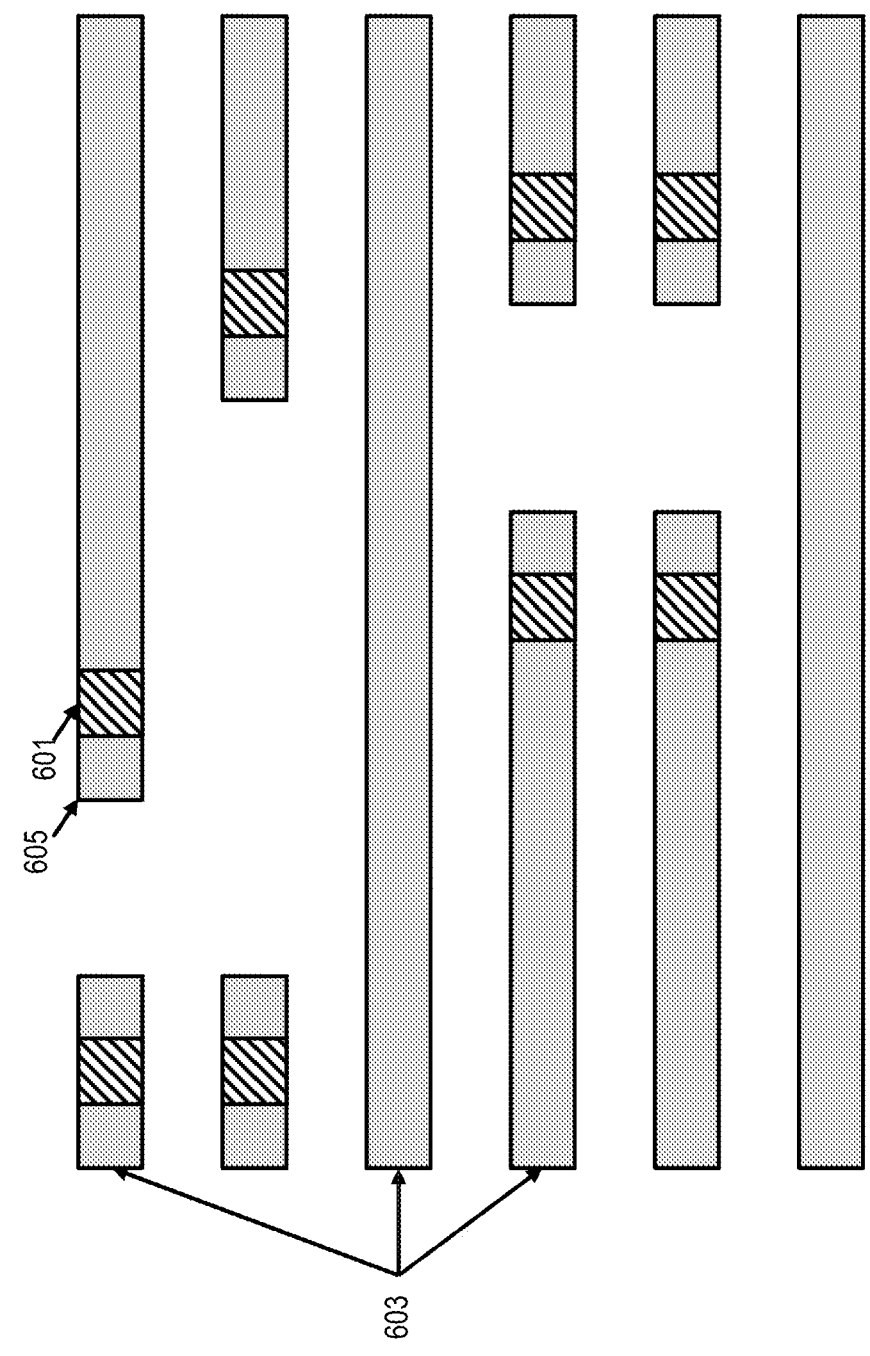
FIGS. 6, 7A, and 8 schematically illustrate a process allowing a high density of features in IC designs using a cut mask design, in accordance with an exemplary embodiment.

Adverting to FIG. 6, an IC design 600 includes a feature 601 (e.g., VIA) overlapping a grating structure of grating pattern 603. As shown, the grating pattern 603 includes a line end 605 (e.g., cut) of a grating structure of a plurality of grating structures.

In step 501, the IC design module 401 determines a feature overlapping a grating pattern that includes a plurality of grating structures of an IC design. For instance, the IC design module 401 determines the line end 605 to be an end of line for the feature 601 to be cut by a cut pattern. As shown the IC design module 401 designates the grating pattern 603 to be formed using a SADP process, or LELELE, or DSA process and designates feature 601 to be a VIA connecting layers of the IC design.

Next, the shape module 405 determines, as in step 503, a shape of a cut pattern overlapping the grating pattern 603. The shape module 405 utilizes the cut mask design module 415 as shown in FIG. 7A and/or the alignment module 417 as shown in FIG. 7B.

Figure 7A:
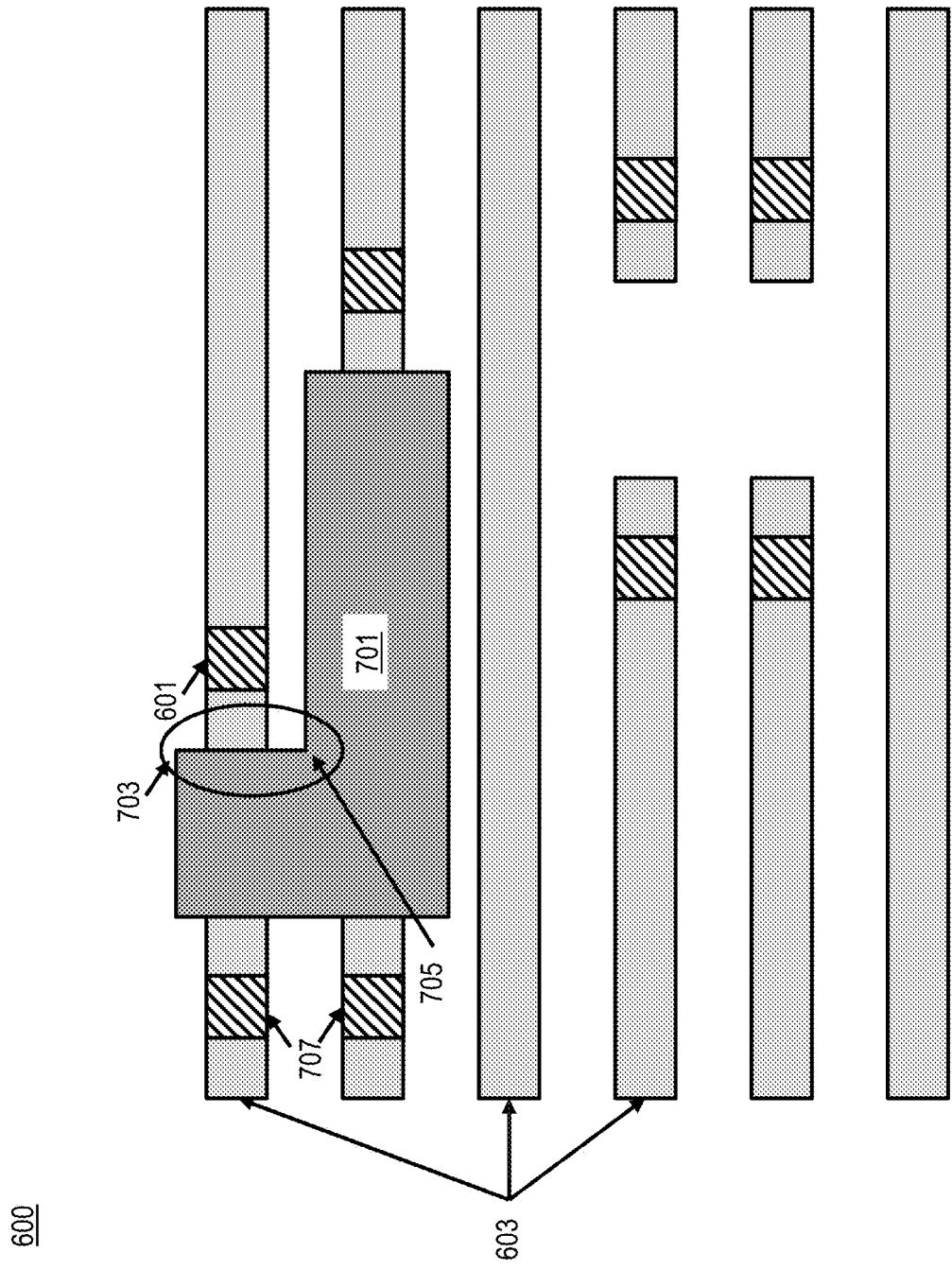

Adverting to FIG. 7A, the cut mask design module 415 accesses a cut mask design from log 413 to determine cut mask design shapes 701. For instance, the shape module 405 designates the shape 701 as an L-type and accordingly designates the shape of the cut pattern for the feature 601 as an L-type. Additionally, or alternatively, the shape module 405 designates a portion 703 of the shape 701 as an L-type portion and accordingly designates the shape of the cut pattern for the feature 601 as an L-type. In yet another example, the shape module 405 designates a corner 705 as an inner corner and accordingly designates the shape of the cut pattern for the feature 601 as an inner corner. As shown, the shape module 405 designates the shape of the cut pattern for the feature 707 as rectangular portion of the L-type shape 701.

Adverting to FIG. 7B, the feature alignment module 417 determines a shape based on an alignment between features in an IC design from log 403. For instance, the alignment module 417 compares a horizontal separation distance 711 between feature 601 and feature 713 to a threshold value. As shown, the feature alignment module 417 designates a shape of the cut pattern for feature 601 as an inner corner based on the separation distance 711 exceeding a threshold value. The threshold value could be zero or a small number. Alternatively, alignment module 417 determines features 715 and 717 to be respectively aligned and accordingly designates a shape of the cut pattern for the features 715 as an outer corner.

The cut designation module 407 may optionally designate a cut type for the feature 601. For instance, the cut designation module 407 designates a cut type as an outer vortex when the designated shape is rectangular and/or when the type of corner is designated as an outer corner. Similarly, the cut designation module 407 designates a cut type as an inner vortex when the designated shape is L-type, C-type, U-type, and the like, and/or when the type of corner is designated as an inner corner.

Figure 8:
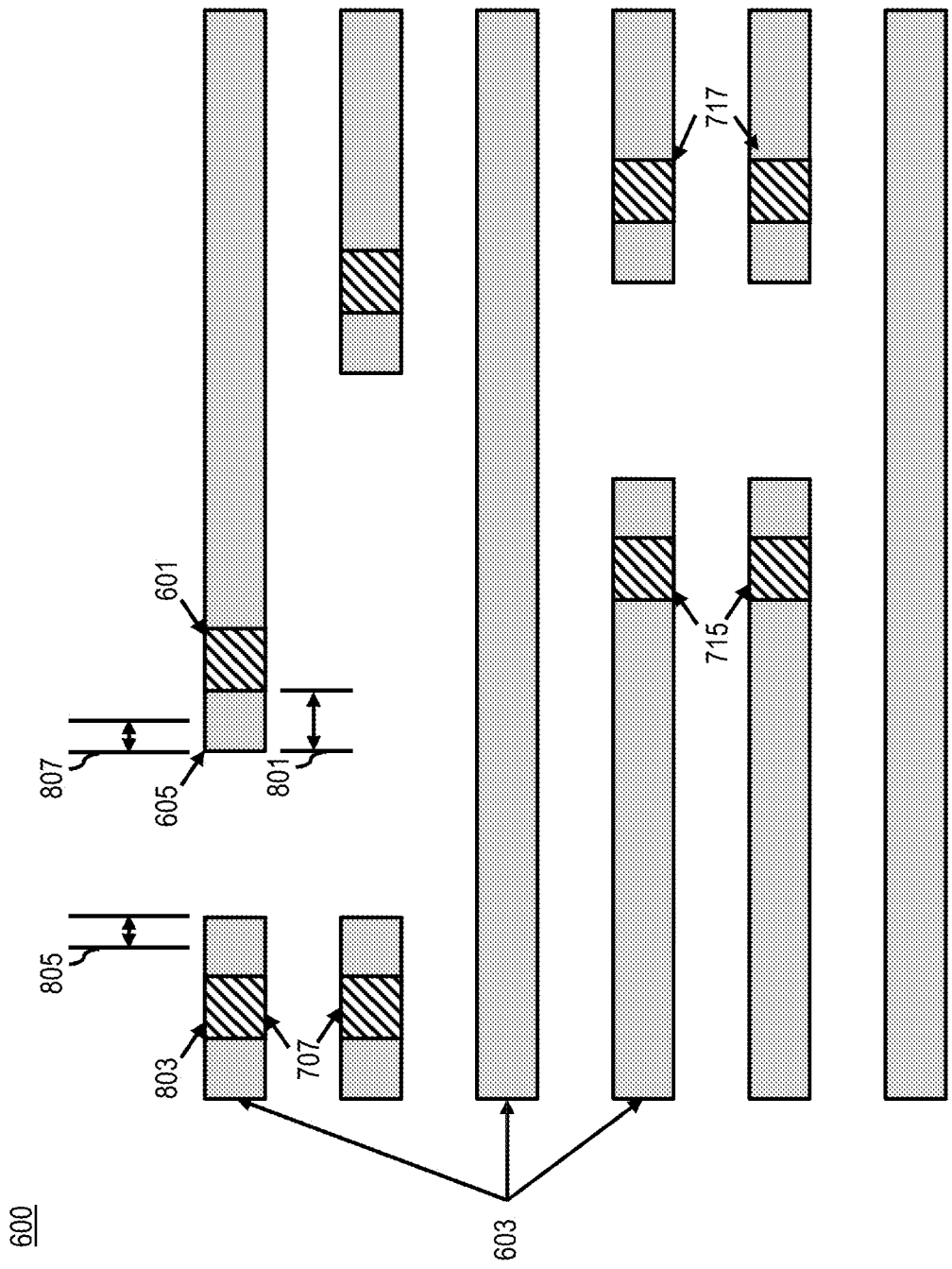

Adverting to FIG. 8, the rule module 409 selects, as in step 505, a rule for the feature 601 based on the determined shape. For instance, the rule module 409 determines the feature 601 to have a cut shape of L-type and/or inner corner and accordingly selects a large minimum distance 801 for the feature. Alternatively, the rule module 409 determines the feature 803 to have a cut mask shape of rectangular type and/or outer corner and accordingly selects a small minimum distance 805 for the feature. As discussed above in FIG. 2, the minimum distance (e.g., 801 and 805) may define distances to accommodate process variations, such as line end shortening. Additionally, or alternatively, the rule module 409 compares a separation distance between the line end 605 and the feature 601 to a threshold value to determine a minimum distance and/or an enclosure rule. For instance, the rule module 409 selects the smaller minimum distance 807 when the feature 605 is separated from the line end 605 by at least the threshold distance.

Furthermore, the rule module 409 may optionally access rule log 411 to select one rule of a set of rules stored in log 411. For instance, the rule log 411 may include conservative and tight enclosure rules assigning large and small minimum distances, respectively, between the feature and a line end of a contact structure for the feature, wherein the tight enclosure rule is selected for the feature when the cut type is designated as an outer vortex. As such, a tight enclosure box allows a high density of features than the conservative enclosure box while maintaining a level of manufacturing yield when placed on features designated as having an outer cut and/or designated as having a rectangular shape.

An experiment using two metal routing layers of a 20 nanometer LELE router demonstrated a 5% cell utilization improvement over traditional methods when using methods described in FIG. 5, and illustrated in FIGS. 6, 7A, 7B, and 8. Furthermore, a larger benefit may be achieved for more than two metal (e.g., M1, M2, etc.) route layers.

Figure 9:
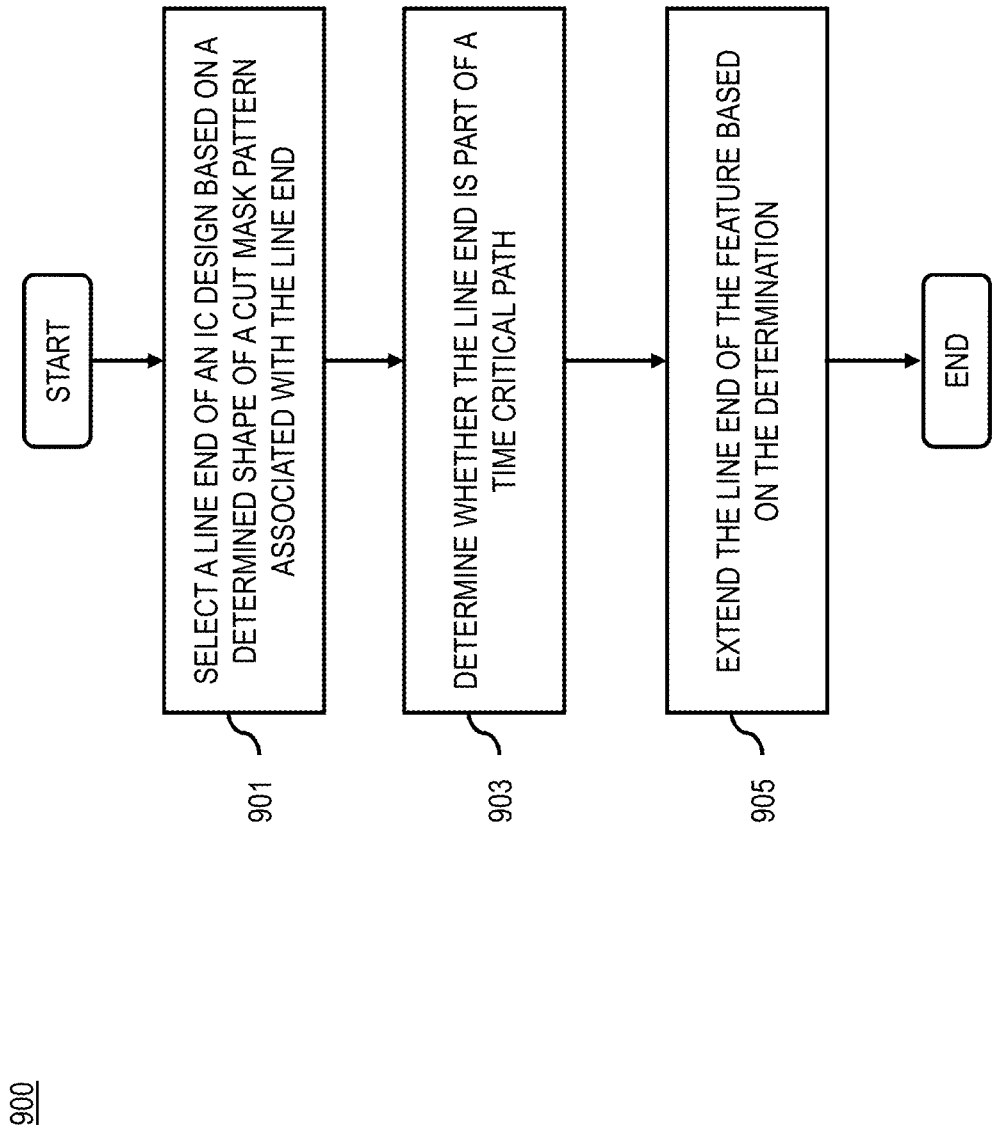
FIG. 9 is a flowchart of a process optimizing an IC design, according to an exemplary embodiment.

FIG. 9 is a flowchart of a process for optimizing an IC design, according to an exemplary embodiment. For illustrative purposes, process 900 is described with respect to the system of FIG. 4 and illustrated in the steps of FIGS. 10 and 11. It is noted that the steps of process 900 may be performed in any suitable order, as well as combined or separated in any suitable manner.

Figure 10:
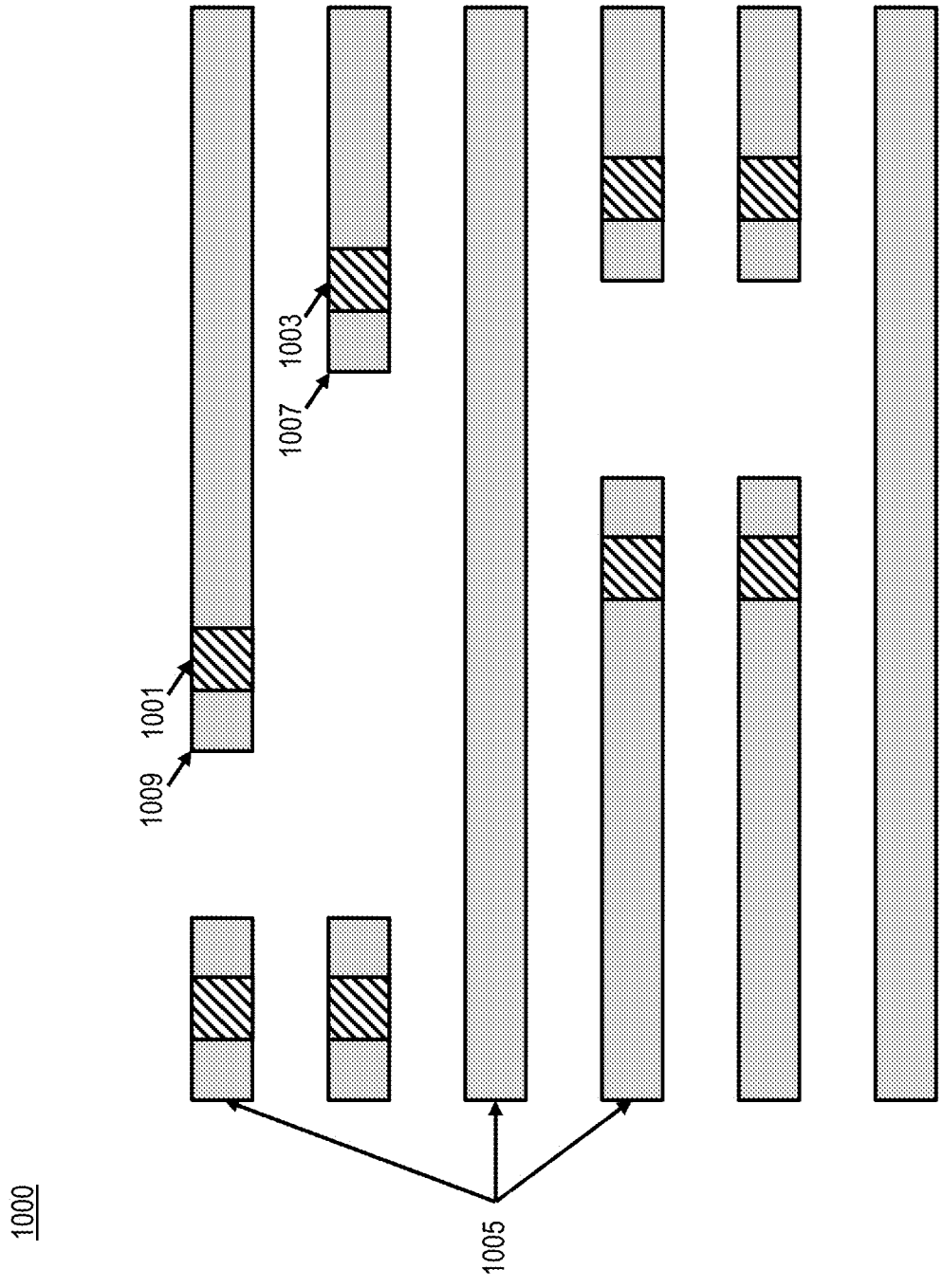
FIGS. 10 and 11 schematically illustrate a process optimizing an IC design, in accordance with an exemplary embodiment.

Adverting to FIG. 10, an IC design 1000 includes features 1001 and 1003 (e.g., VIAs) overlapping a grating structure of grating pattern 1005. As shown, the grating pattern 1003 includes line ends 1007 and 1009 (e.g., cut) for features 1001 and 1003, respectively. In step 901, IC design module 401 selects line end 1007 and feature 1003 based on a determined shape of a cut mask pattern associated with line end 1007. For example, the shape is determined based on a cut mask design for line ends 1007 and 1009 as illustrated in FIG. 7A and/or based on an alignment between line ends 1007 and 1009 as illustrated in FIG. 7B.

In step 903, the IC design module 401 determines whether the line end 1007 (and/or feature 1003) is on a time critical path. For example, the IC design module 401 may be configured to determine whether an electronic circuit connected to line end 1007 (or feature 1003) is sensitive to time delays and/or whether a time delay added by extending the line end 1007 to align with line end 1009 results in a time delay that reduces timing performance of a resulting IC. In another example, the IC design module 401 determines whether extending the line end 1007 to align with line end 1009 results in a parasitic capacitance that impacts timing performance of a resulting IC design. It is contemplated that the determination of whether the line end 1007 is on a critical time path may be based on a determination by commercial electronic design automation (EDA) software.

Figure 11:
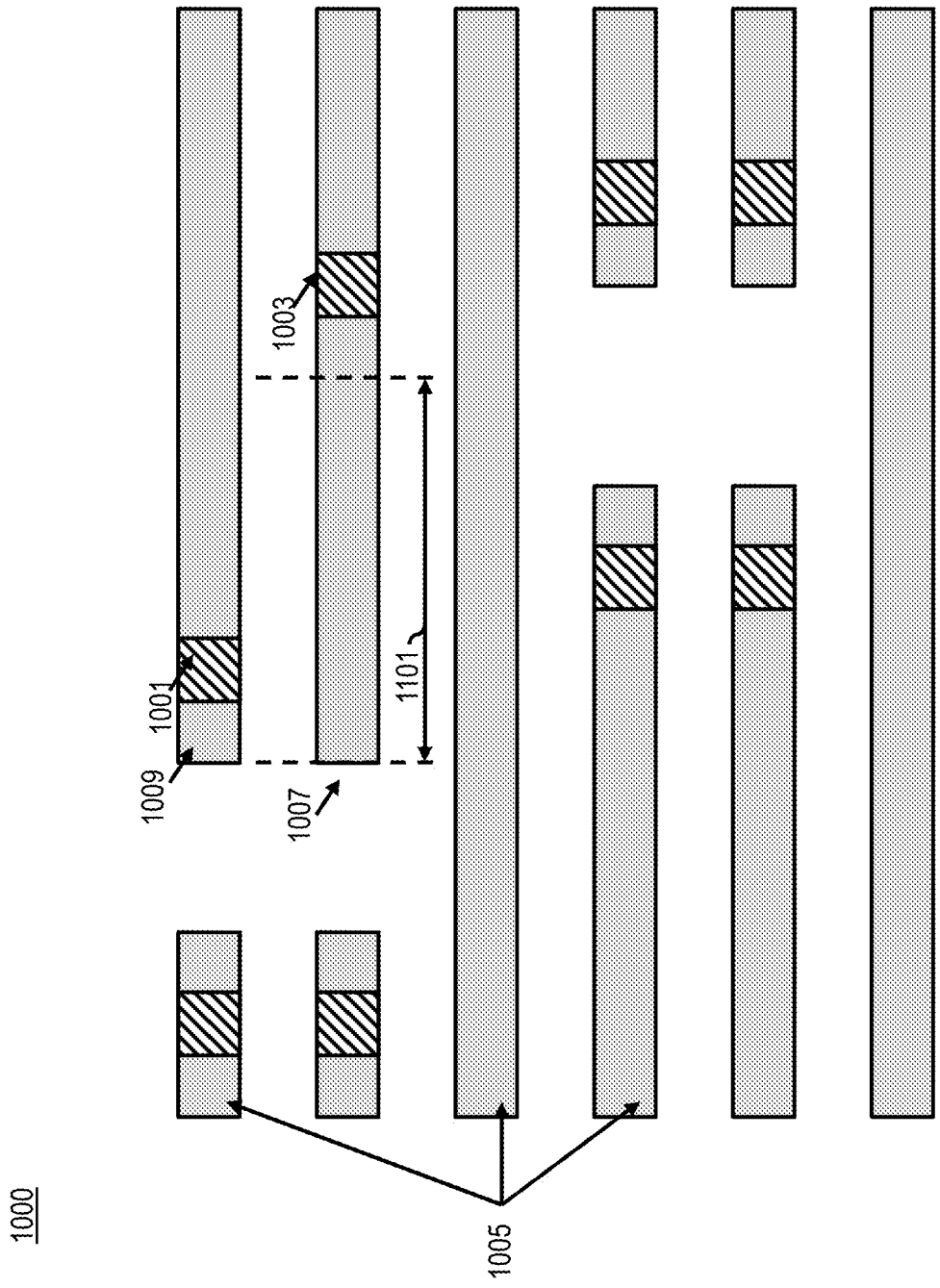

Adverting to FIG. 11, the IC design module 401 extends, as in step 905, the line end 1007 based on the determination. For example, the IC design module 401 modifies a cut mask to a rectangular shape to generate the line end 1101 when the line end 1007 and/or feature 1003 is determined to not be on a time critical path. Additionally or alternatively, the line end 1101 may be extended to align with line end 1009, thereby reducing or removing an inner corner of a cut mask. As shown, the IC design module 401 extends the line end a separation distance 1101 previously separating line ends 1007 and 1009. Furthermore, the rule module 409 may select a tight rule for the feature 1001 instead of a conservative rule based on a new determined shape (e.g., rectangular), thereby reducing the physical area of an IC design.

Figure 12:
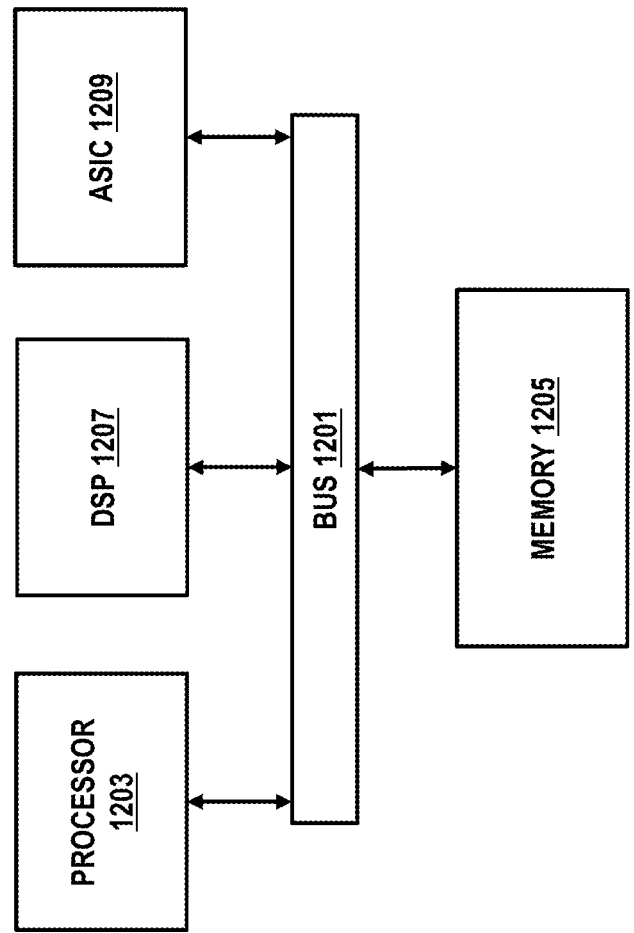
FIG. 12 illustrates a diagram of a chip set that can be used to implement exemplary embodiments.

FIG. 12 illustrates a diagram of a chip set that can be used to implement exemplary embodiments. Chip set 1200 is programmed to enable a selection of design rules that allow for a high density of features of IC designs while maintaining a manufacturing yield level as described herein and includes, for instance, the processor and memory components described with respect to FIG. 12 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 1200, or a portion thereof, constitutes a means for performing one or more steps of FIGS. 5 through 11.

The chip set 1200 may include a communication mechanism such as a bus 1201 for passing information among the components of the chip set 1200. A processor 1203 has connectivity to the bus 1201 to execute instructions and process information stored in, for example, a memory 1205. The processor 1203 may include one or more processing cores with each core configured to perform independently. A multi-core processor enables multiprocessing within a single physical package. Examples of a multi-core processor include two, four, eight, or greater numbers of processing cores. Alternatively or in addition, the processor 1203 may include one or more microprocessors configured in tandem via the bus 1201 to enable independent execution of instructions, pipelining, and multithreading. The processor 1203 may also be accompanied by one or more specialized components to perform certain processing functions and tasks such as one or more digital signal processors (DSP) 1207, or one or more application-specific integrated circuits (ASIC) 1209. A DSP 1207 typically is configured to process real-world signals (e.g., sound) in real time independently of the processor 1203. Similarly, an ASIC 1209 can be configured to performed specialized functions not easily performed by a general purpose processor. Other specialized components to aid in performing the inventive functions described herein include one or more field programmable gate arrays (FPGA) (not shown), one or more controllers (not shown), or one or more other special-purpose computer chips.

The processor 1203 and accompanying components have connectivity to the memory 1205 via the bus 1201. The memory 1205 includes both dynamic memory (e.g., RAM, magnetic disk, writable optical disk, etc.) and static memory (e.g., ROM, CD-ROM, etc.) for storing executable instructions that when executed perform the inventive steps described herein. The memory 1205 also stores the data associated with or generated by the execution of the inventive steps.

The embodiments of the present disclosure can achieve several technical effects, including an improvement in a density of features of an IC and/or a manufacturing yield of an IC. The present disclosure enjoys industrial applicability in any of various types of highly integrated semiconductor devices, particularly large IC designs utilizing gratings, particularly for the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining a feature overlapping a grating pattern of an integrated circuit (IC) design, the grating pattern including a plurality of grating structures;
   determining a shape of a cut pattern overlapping the grating pattern; and
   selecting, via at least one processor, one of a plurality of rules for the feature based on the determined shape.

2. The method according to claim 1, further comprising:
   designating a type for a line end cut indicated by the cut pattern based on the determined shape, the selection of the one rule being further based on the cut type.

3. The method according to claim 2, further comprising:
   determining a separation distance between the feature and the line end cut, the selection of the one rule being further based on the separation distance.

4. The method according to claim 2, further comprising:
   designating the cut type as an inner or outer vortex, the designation of an inner vortex indicating a process variation extending the cut pattern outside a region indicated by the cut pattern and the designation of an outer vortex indicating a process variation extending the cut pattern inside a region indicated by the cut pattern, wherein the plurality of rules comprise:
   conservative and tight enclosure rules assigning first and second minimum distances, respectively, between the feature and a line end of a contact structure for the feature, wherein the tight enclosure rule is selected for the feature when the cut type is designated as an outer vortex.

5. The method according to claim 1, wherein the feature overlaps one grating structure of the plurality of grating structures and the cut pattern overlaps the one grating structure, further comprising:
   determining whether the feature is on a time critical path of the IC design; and
   modifying the cut pattern to extend the one grating structure based the shape and on whether the feature is on a time critical path, wherein the selection of the one rule is based on the modified cut pattern.

6. The method according to claim 5, wherein a conservative enclosure rule is selected for the feature and/or another feature of the IC design before modifying the cut pattern and a tight enclosure rule is selected for the feature and/or another feature of the IC design after modifying the cut pattern.

7. The method according to claim 1, further comprising:
determining at least a portion of a cut mask design corresponding to the cut pattern, wherein the shape is determined based on the portion of the cut mask design.

8. The method according to claim 1, further comprising:
determining an alignment between the first feature and a second feature in the IC design, the first and second features being positioned on adjacent grating structures of the plurality of grating structures, wherein the determination of the shape is based on the determined alignment.

9. An apparatus comprising:
a processor; and
a memory including computer program code for a program,
the memory and the computer program code configured to, with the processor, cause the apparatus to perform the following;
determine a feature overlapping a grating pattern of an integrated circuit (IC) design, the grating pattern including a plurality of grating structures;
determine a shape of a cut pattern overlapping the grating pattern; and
select one of a plurality of rules for the feature based on the determined shape.

10. The apparatus according to claim 9, wherein the apparatus is further caused to:
designate a type for a line end cut indicated by the cut pattern based on the determined shape, the selection of the one rule being further based on the cut type.

11. The apparatus according to claim 10, wherein the apparatus is further caused to:
determine a separation distance between the feature and the line end cut, the selection of the one rule being further based on the separation distance.

12. The apparatus according to claim 10, wherein the apparatus is further caused to:
designate the cut type as an inner or outer vortex, the designation of an inner vortex indicating a process variation extending the cut pattern outside a region indicated by the cut pattern and the designation of an outer vortex indicating a process variation extending the cut pattern inside a region indicated by the cut pattern, wherein the plurality of rules comprise:
conservative and tight enclosure rules assigning first and second minimum distances, respectively, between the feature and a line end of a contact structure for the feature, wherein the tight enclosure rule is selected for the feature when the cut type is designated as an outer vortex.

13. The apparatus according to claim 9, wherein the feature overlaps one grating structure of the plurality of grating structures and the cut pattern overlaps the grating structure and the apparatus is further caused to:
determine whether the feature is on a time critical path of the IC design; and
modify the cut pattern to extend the grating structure based on the shape and on whether the feature is on a time critical path, wherein the selection of the one rule is based on the modified cut pattern.

14. The apparatus according to claim 13, wherein a conservative enclosure rule is selected for the feature and/or another feature of the IC design before modifying the cut pattern and a tight enclosure rule is selected for the feature and/or another feature of the IC design after modifying the cut pattern.

15. The apparatus according to claim 9, wherein the apparatus is further caused to:
determine at least a portion of a cut mask design corresponding to the cut pattern, wherein the shape is determined based on the portion of the cut mask design.

16. The apparatus according to claim 9, wherein the apparatus is further caused to:
determine an alignment between the first feature and a second feature in the IC design, the first and second features being positioned on adjacent grating structures of the plurality of grating structures, wherein the determination of the shape is based on the determined alignment.

17. A method comprising:
determining a vertical interconnect access (VIA) overlapping a grating structure of a plurality of grating structures extending in one direction of an integrated circuit (IC) design;
determining a shape of a cut pattern overlapping the grating structure;
designating a cut of the grating structure indicated by the cut pattern as an inner or outer vortex based on the determined shape, the designation of inner vortex indicating a process variation extending the cut pattern outside a region indicated by the cut pattern and the designation of outer vortex indicating a process variation extending the cut pattern inside a region indicated by the cut pattern; and
selecting, via at least one processor, a conservative or tight enclosure rule based on the designation of the cut, the conservative and tight enclosure rules defining first and second minimum distances, respectively, between the VIA and a line end of a contact structure for the VIA, wherein the first minimum distance is larger than the second minimum distance.

18. The method according to claim 17, further comprising:
determining a separation distance between the VIA and the cut, the selection of the conservative or tight enclosure rule being further based on the separation distance.

19. The method according to claim 17, further comprising at least one of the following:
determining at least a portion of a cut mask design corresponding to the cut pattern, wherein the shape is determined based on the portion of the cut mask design; and
determining an alignment between the first VIA and a second VIA overlapping a second grating structure of the plurality of grating structures, the first and second gratings being adjacent, wherein the determination of the shape is based on the determined alignment.

20. The method according to claim 17, further comprising:
determining whether the VIA is on a time critical path of the IC design; and
modifying the cut pattern to extend the grating structure based on whether the feature is on a time critical path and on the determined shape and/or designated cut, wherein a conservative enclosure rule is selected for the VIA and/or another VIA of the IC design before modifying the cut pattern and a tight enclosure rule is selected for the VIA and/or another VIA of the IC design after modifying the cut pattern.

* * * * *